(12) United States Patent (10) Patent No.: US 7,312,004 B2
Xiao (45) Date of Patent: Dec. 25, 2007

(54) EMBEDDED ATTENUATED PHASE SHIFT MASK WITH TUNABLE TRANSMISSION

(75) Inventor: Guangming Xiao, Austin, TX (US)

(73) Assignee: Photronics, Inc., Brookfield, CT (US)

( * ) Notice: Subject to any disclaimer, the term of this patent is extended or adjusted under 35 U.S.C. 154(b) by 375 days.

(21) Appl. No.: 10/803,847

(22) Filed: Mar. 18, 2004

(65) Prior Publication Data

US 2005/0208390 A1 Sep. 22, 2005

(51) Int. Cl.
*G03F 1/00* (2006.01)

(52) U.S. Cl. .......................................................... 430/5

(58) Field of Classification Search ................... 430/5, 430/394
See application file for complete search history.

(56) References Cited

U.S. PATENT DOCUMENTS

| | | | |
|---|---|---|---|
| 5,618,643 A | 4/1997 | Dao et al. | |
| 5,789,116 A | 8/1998 | Kim | |
| 6,261,725 B1 | 7/2001 | Tzu et al. | |
| 6,277,528 B1 | 8/2001 | Tzu et al. | |
| 6,403,267 B1 | 6/2002 | Tzu et al. | |
| 6,406,818 B1 | 6/2002 | Zemen et al. | |
| 6,436,588 B1 | 8/2002 | Mason et al. | |
| 6,472,766 B2 * | 10/2002 | Xiao | 257/797 |
| 6,902,851 B1 * | 6/2005 | Babcock et al. | 430/5 |
| 7,022,436 B2 * | 4/2006 | Cummings | 430/5 |
| 2002/0127881 A1 | 9/2002 | Xiao | |

* cited by examiner

*Primary Examiner*—S. Rosasco
(74) *Attorney, Agent, or Firm*—Amster, Rothstein & Ebenstein LLP

(57) ABSTRACT

The attenuation and phase shift properties of an embedded attenuated phase shift mask (EAPSM) may be independently selected. After or during plowing of regions of an embedded phase shift layer, exposed regions of a substrate are etched to a predetermined depth. Additional regions of the embedded phase sift layer are then exposed and trimmed to a predetermined thickness for providing the desired amount of attenuation, with the final etched depth of the substrate compensating for the change of relative phase shift caused by trimming of the phase shift layer. A matrix test device having a plurality of cells with different levels of attenuation and/or phase shift may then be fabricated on a single EAPSM blank.

21 Claims, 4 Drawing Sheets

EMBEDDED ATTENUATED PHASE SHIFT MASK WITH TUNABLE TRANSMISSION

TECHNICAL FIELD OF THE INVENTION

The invention pertains generally to embedded attenuated phase shift masks (EAPSM) for optical lithography.

BACKGROUND OF THE INVENTION

Optical lithography is the predominate process for making integrated circuits. Integrated circuits are built as a series of layers, sometimes 15 or more. To form each layer of an integrated circuit, the wafer is coated with a photosensitive polymer, called a photoresist. The layer of photoresist is exposed to a pattern of light. Depending on the type of photoresist, certain areas of the photoresist are soluable following exposure and are rinsed with a solvent. The remaining photoresist, which is insoluable, delineates a pattern on the surface of the wafer that is protected from the next processing step, which could be, for example, etching, dielectric or metal deposition, or ion implantation. The regions delineated by the boundaries of the remaining photoresist correspond to physical elements, such as parts of transistors and connections between them, to be reproduced on each integrated circuit.

To form the pattern of light on the wafer, an "illuminator" is used to create a coherent, uniform beam of light that is projected through a photomask (or "mask") or reticle. A mask is typically a plate made of quartz or other translucent material, and the pattern on the mask is formed with chrome or other opaque material disposed on the surface on the plate. This chrome layer may also be covered with an anti-reflective layer of chrome oxide. A lens system collects the light transmitted through the mask and focuses it on a small area of a semiconductor wafer, thereby creating a scaled-down image on the photoresist. The exposure is repeated across and down the wafer by incrementally moving the wafer using a "stepper" machine, thereby an array of side-by-side images on the photoresist covering the wafer.

As the size of features of integrated circuits shrink, the wavelength of light illuminating the masks must also decrease. However, quartz lenses that are used in the illuminator and lens systems absorb wavelengths of light shorter than 193 nm and therefore cannot be used for smaller wavelengths of light. Although equipment has been proposed that is capable of using a shorter wavelength of light, there exist several resolution enhancement techniques that permit the same wavelength of light to resolve smaller features. For example, using known resolution enhancement techniques, 193 nm light can be used to resolve features as small as 100 nm or less.

One of type of resolution enhancement technique is to improve contrast between the light and dark areas of the pattern projected onto the wafer using destructive interference. Phase shifting may be accomplished several different ways. One is by very precisely etching part of the substrate. Such a mask is sometimes referred to as a Levenson phase shift mask (PSM) or alternating aperture PSM (AAPSM). A different approach is the use of an embedded layer that both shifts the phase of the light and attenuates it. This type of mask is called an attenuating phase shift mask (EAPSM). It too sets up destructive interference along the border of a feature region. However, unlike a AAPSM, an EAPSM is considered to be a weak phase shifter due to relatively high degree of attenuation of the light. Typically only of 6% of the incident radiation is transmitted. An opaque film of material—for example a material comprised or based of molybdenum silicide (MoSi)—is applied to the substrate. This material shifts phase of the light that passes through it by 180 degrees and substantially attenuates it. The resulting image becomes sharper at the feature region borders as a result of the small amount of 180 degree phase shifted light destructively interfering with the unshifted light passing through the adjacent opening. The transmission and phase shift provided by the phase shift layer depend on radiation wavelength and the intrinsic properties of the phase shift layer material (e.g., its absorption coefficient and index of refraction). Thus, for a particular radiation wavelength, the transmission and phase shift of the radiation incident on the phase shift layer of a mask become a function of the thickness of the phase shift layer.

SUMMARY OF THE INVENTION

One problem with embedded attenuated phase shift masks is finding a phase-shifting material that satisfies both transmission and phase shift requirements. Another problem is that it is not always clear what the best or optimal transmittance is for a given mask, especially if off-axis illumination techniques are used. A given material, e.g., MoSi, can only work within a limited range of transmittance. Changing the phase-shifting material requires changing the fabrication process. And, blank embedded masks with different transmittances are relatively costly and difficult to produce.

A preferred embodiment of the invention is useful in overcoming one or more of these and other problems by permitting transmittance of the phase shifting layer to be controlled independently of phase shift. According to an example of a process employing the invention in its preferred embodiment, a mask is processed in a conventional fashion in order to expose feature regions of the substrate. This processing includes removing or etching the opaque and phase-shifting layers of a mask blank. However, unlike conventional processing, exposed regions of the substrate are then etched to a predetermined depth. Selected portions of the opaque layer are removed, thereby exposing certain areas of the phase shifting layer. A second etch is made to cut down the thickness of the exposed regions of the phase-shifting layer. Depending on the selectivity of the etching process, an additional amount of the exposed regions of the substrate may also be etched. The amount of etching during the second etch is dictated by the desired transmittance of the embedded phase-shifting layer. The thickness of the phase-shifting layer determines its transmittance. The first etch of the substrate compensates at least in part for the loss of phase shift caused by the thinning of the phase shifting layer. The depth of the first substrate etch is selected so that the final phase shift between radiation passing directly through the etched regions of the substrate and the phase shifting layer is the desired phase shift.

One advantage of being able to control the transmittance of an embedded phase shifting layer in this manner is that a matrix of test device with different transmissions and phase shifting angles can be fabricated on a single photomask. By integrating multiple phase shift parameters such as transmission, phase, and tri-tone on a single mask, different phase shift parameters can be directly compared and optimized for best wafer lithography results. Furthermore, almost all lithography data of high-transmission phase shift masks for 193 nm and 157 nm radiation wavelengths are based on simulations. Using a matrix with different transmission and shifting angles enables collection of real wafer lithography data to determine the best phase shift mask configuration for 193 nm or 157 nm lithography. Additional advantages include reduction of costs associated with using multiple photomasks and elimination in variations in wafer processing.

DETAILED DESCRIPTION OF THE DRAWINGS

Figure 1A:
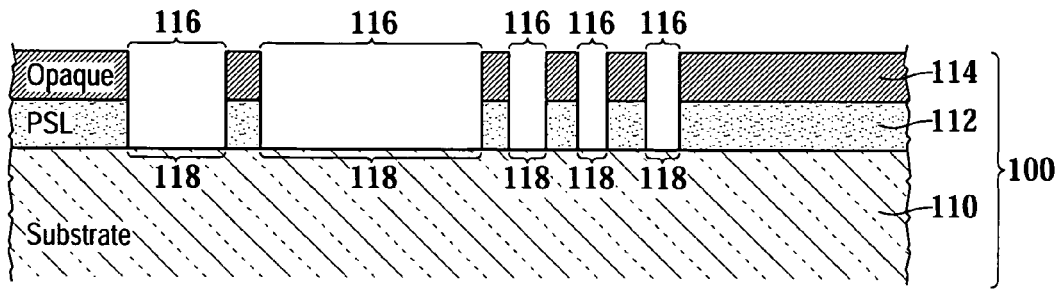
FIG. 1A is a cross sectional schematic of a portion of an embedded attenuated photomask blank after regions of an opaque layer and an embedded phase shift material have been removed.
Figure 1B:
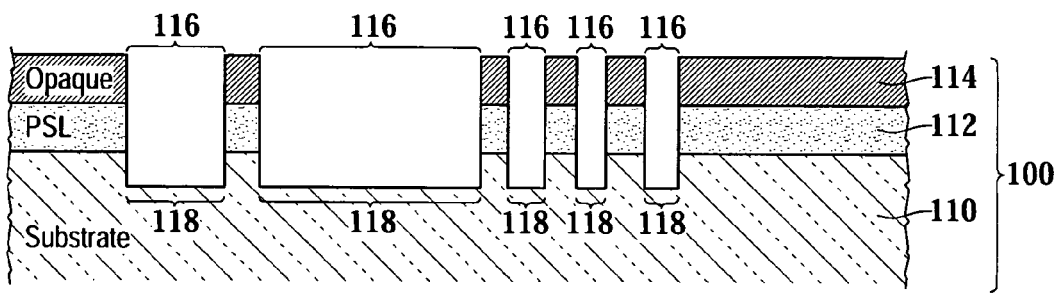
FIG. 1B is a cross section schematic of the portion of the photomask shown in FIG. 1A with certain regions of a substrate removed.

Like numerals are used for like and corresponding parts throughout the various drawings.

FIGS. 1A-1D and FIGS. 2A and 2B are cross-sectional schematics of representative examples of a portion of a photomask blank 100 after certain steps of an example of a process for fabricating embedded attenuated phase shift mask (EAPSM). In this process, attenuation of an embedded phase shift layer is controlled independently of phase shift. In both examples, the blank includes a substrate 110 formed of a substantially transparent material, e.g., quartz, an embedded phase shift layer 112 of thickness $H_o$ is disposed on substrate layer 110, and an opaque layer 114 overlaying the embedded phase shift layer. Phase shift layer 112 is comprised of, for example, molybdenum silicide (MoSi), titanium nitride, silicon nitride or another suitable material. Opaque layer 114 is comprised of, for example, chrome or other opaque material. In the illustrated example, the phase shift layer is comprised of MoSi, the opaque material is comprised of chrome and the substrate is comprised of quartz.

Figure 2A:
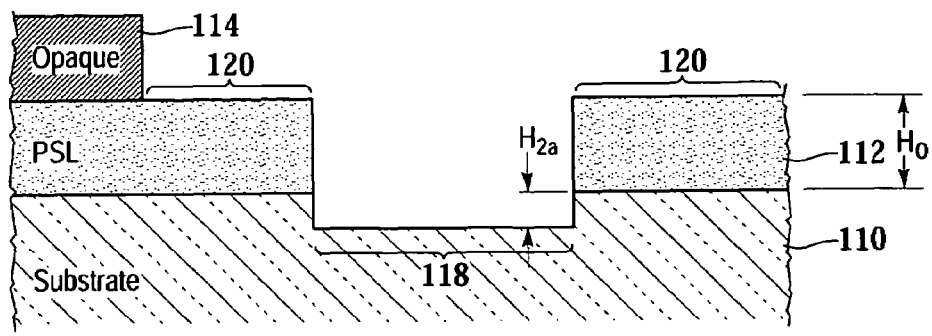
FIG. 2A is a cross-sectional schematic of a portion of embedded attenuated phase shift photomask after a region of an embedded phase shift layer has been completely removed and an underlying region of substrate has been etched.

Un-attenuated feature regions 116 are first formed by removing overlaying regions of the opaque layer to form a desired circuit pattern. Exposed portions of phase shift layer 112 are then removed, or "plowed," using well known etching techniques. An example of a result of this step is shown in FIG. 1A. This step creates or reveals exposed feature regions 118 of substrate 110. In FIG. 11B and FIG. 2A, the exposed regions of the substrate have been etched to a predetermined depth, creating regions in which the substrate is etched below its planar surface. This etching of the substrate can occur during the etching process for the embedded phase shift layer 112 by over-etching the phase shift layer.

Figure 1C:
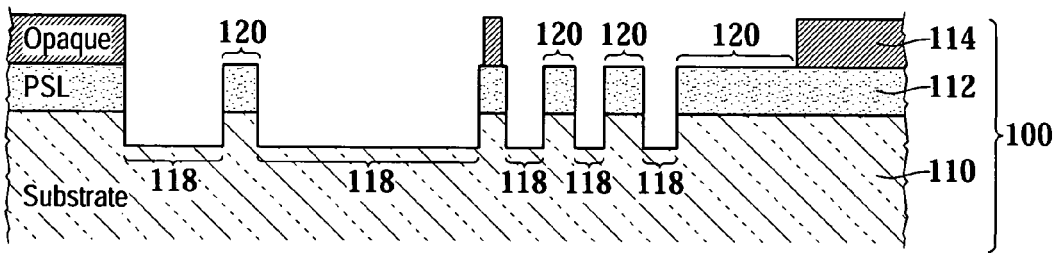
FIG. 1C is a cross sectional schematic of the portion of the photomask shown in FIG. 1A after additional regions of the opaque layer are removed, exposing regions of the underlying phase shift layer.
Figure 1D:
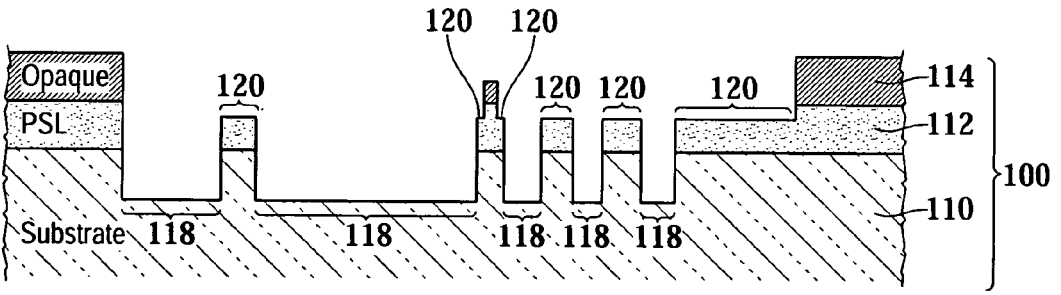
FIG. 1D is a cross sectional schematic of the portion of the photomask shown in FIG. 1A after certain exposed regions of the embedded phase shift layer have been trimmed.
Figure 2B:
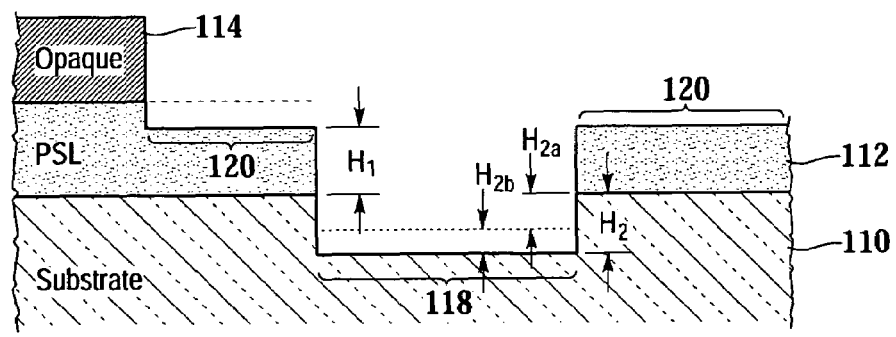
FIG. 2B is a cross sectional schematic the portion of the photomask of FIG. 2A after exposed portions of the embedded phase shift layer have been thinned (and an additional amount of substrate removed, depending on selectivity of etching process) to a arrive at a desired or preselected level of attenuation.

With well known second level process steps including resist coat, second exposure, develop and etch, certain regions of the opaque layer 114 are then removed to expose regions 120 of the underlying phase shift layer 112, as shown in the example of FIG. 1C. These regions of the phase shift layer will transmit radiation at attenuated levels (compared to radiation passing through regions 118) during use of the photomask. The final basic step of the process is the removal by etching or otherwise of a predetermined thickness, but less than the entire thickness, of portions of, or all of, the exposed regions 120 of phase shift layer 112. Representative examples of the resulting structure are shown in FIG. 1D and FIG. 2B. Depending on the selectivity of the etchant, exposed regions 118 of substrate 110 may also be etched. A highly selective etching process may result in little to none of the substrate being etched. However, a less selective etching process will remove additional amounts of the substrate, thus further deepening the wells formed in the substrate.

The first and second etch processes will also be referred to as the "plow" and "trim" processes. The first process completely removes—thus "plows"—regions of the embedded phase shift layer. The second process merely removes a top portion of embedded phase shift layer, thus "trimming" it to a desired transmitivity.

If it is assumed that the substrate and the phase shift layers are homogeneous, the etch times for the plow and trimmer steps may be determined analytically using the following equations:

$$t_2 = \frac{H_0}{r_1'}\left(1 - \frac{\ln T}{\ln T_0}\right) \qquad \text{Eq. (1)}$$

$$t_1 = \frac{H_0}{r_1} + \frac{1}{r_2}\left[\frac{\lambda}{2(n_2-1)}\left(1 - \frac{\Phi_0}{\pi}\frac{\ln T}{\ln T_0}\right) - \frac{r_2'}{r_1'}H_0\left(1 - \frac{\ln T}{\ln T_0}\right)\right] \qquad \text{Eq. (2)}$$

where the variables have the following meanings:

$t_1$: the total time required for the first etch process $t_2$: the amount of time required for the second etch process $r_1$: etch rate of embedded phase shift material during first etch process (plow)

$H_0$: initial phase shift layer thickness (embedded)

$T_0$: initial transmission of untrimmed embedded phase shift layer at wavelength $\lambda$ $T$: desired transmission of embedded phase shift material at wavelength $\lambda$ $\Phi_0$: phase angle of untrimmed embedded phase shift layer at wavelength $\lambda$ $n_1$: index of refraction of embedded phase shift layer at wavelength $\lambda$ $n_2$: index of refraction of substrate at wavelength $\lambda$ $r_1$: etch rate of embedded phase shift material during first etch process (plow)

$r_1'$: etch rate of embedded phase shift material during second etch process (trim)

$r_2$: substrate etch rate during first etch process plow) $r_2'$: etch rate of substrate during the second phase shifter etch process (trim)

Referring now only to FIGS. 2A and 2B, the derivation of equations (1) and (2) are explained below. The following variables are used to indicate the dimensions of the phase shift layer and substrate layers:

$\Delta H$: amount of phase shift material removed during the second etch process ($\Delta H = H_0 - H_1$)

$H_1$: final thickness embedded phase shift layer after second etch (trim)

$H_{2a}$: depth of substrate removed during first etch process (plow)

$H_{2b}$: depth of substrate removed during the second etch process (trim)

$H_2$: final thickness of substrate after second etch process ($H_2 = H_{2a} + H_{2b}$)

These dimensions are indicated in the example illustrated in FIGS. 2A and 2B.

The examples FIGS. 2A and 2B. The equations given above for the etch times for the first (plow) and second (trim) etch processes are derived as follows.

The transmission of the phase shift layer 112 is generally defined by:

$$T = e^{-\alpha t} \qquad \text{Eq. (3)}$$

T is the transmission of phase shifting material with thickness t and absorption coefficient $\alpha$ at given wavelength $\lambda$. The phase angle of radiation passing through phase shift layer 112 is generally defined by:

$$\Phi = \frac{2\pi}{\lambda}(n-1)t \qquad \text{Eq. (4)}$$

$\Phi$ is phase shifting angle of phase shifting layer in ambient air, t is the thickness of phase shifting layer, and n is index of refraction of phase shifting layer at given wavelength $\lambda$. Thus, for a mask having a phase shift layer of thickness $H_0$ of a particular phase shifting material, the transmission and phase shifting angle of radiation incident on phase shift layer 112 are each a function of the thickness t of the phase shift layer 112 for a particular incident radiation wavelength.

An equation for calculating the final thickness $H_1$ of the embedded phase shift layer after the second etching process can be derived based on the known initial thickness $H_0$, the initial transmission $T_0$ of the untrimmed, embedded phase shift layer, and the desired final transmission T of the trimmed embedded phase shift layer from equations (3) and (4) as follows:

$$T_o = e^{-\alpha_1 H_0} \qquad \text{Eq. (5)}$$

and $$T = e^{-\alpha_1 H_1} \qquad \text{Eq. (6)}$$

These two equations can be combined to arrive at:

$$H_1 = H_0 \frac{\ln T}{\ln T_0} \qquad \text{Eq. (7)}$$

The amount or thickness of the embedded phase shift layer to be trimmed during the second etching process is therefore given by:

$$\Delta H = H_0 - H_1 = H_0\left(1 - \frac{\ln T}{\ln T_0}\right) \qquad \text{Eq. (8)}$$

The etch time for trimming the embedded phase shift layer 112 at regions 120 during the second etching process, $t_2$ is thus:

$$t_2 = \frac{\Delta H_1}{r_1'} = \frac{H_0}{r_1'}\left(1 - \frac{\ln T}{\ln T_0}\right) \qquad \text{Eq. (9)}$$

Because of finite selectivity between the embedded phase shift material and the substrate material during the second etching process, some thickness of the exposed regions 118 of the substrate will also be removed during the second etching process. The amount removed is designated $H_{2b}$ and is determined according to the following equation:

$$H_{2b} = r_2' t_2 = \frac{r_2'}{r_1'} H_0\left(1 - \frac{\ln T}{\ln T_0}\right) \qquad \text{Eq. (10)}$$

It is preferable that the relative phase angle between the attenuated radiation passing through phase shift layer 112 in regions 120 and the unattenuated radiation passed through just substrate layer 110 via regions 118 is 180° or $\pi$ radians in order to create a maximum amount of destructive interference at the feature edges. However, any phase shift could be chosen, if desired. The phase angle between the radiation passed through phase shift layer 112 via regions 120 and substrate layer 110 via regions 118 depends on the thickness ($H_1$) of trimmed phase shift layer 112 and the total thickness ($H_2$) of substrate layer 110 removed during the two etching processes. The relationship may be expressed as follows:

$$\pi = \frac{2\pi}{\lambda}(n-1)H_1 + \frac{2\pi}{\lambda}(n_2-1)H_2 \qquad \text{Eq. (11)}$$

where $n_2$ is the index of refraction of substrate layer 110 at radiation of wavelength $\lambda$.

Substituting equation (7) for $H_1$ and knowing that $\Phi_0 = (2\pi/\lambda)(n_1-1)H_0$, the total thickness $H_2$ required to be removed from substrate layer 110 can be calculated as follows:

$$H_2 = \frac{\lambda}{2(n_2-1)}\left(1 - \frac{\Phi_0}{\pi}\frac{\ln T}{\ln T_0}\right) \qquad \text{Eq. (12)}$$

The total thickness $H_2$ of substrate layer 110 required to be removed during both the first and second etching processes is the sum of the thickness removed during each of the two etching processes, namely $H_2=H_{2a}+H_{2b}$, where $H_{2a}$ is the thickness of the substrate removed during the first etching process and $H_{2b}$ is the thickness of the substrate removed during the second etching process. Substituting equations (10) and (12) for $H_2$ and $H_{2b}$, $H_{2a}$ can be determined as follows:

$$H_{2a} = \frac{\lambda}{2(n_2-1)}\left(1 - \frac{\Phi_0}{\pi}\frac{\ln T}{\ln T_0}\right) - \frac{r_2'}{r_1'}H_0\left(1 - \frac{\ln T}{\ln T_0}\right) \qquad \text{Eq. (13)}$$

The total etch time required for the first etch process $t_1$ equals the time to remove the embedded phase shift 112 layer ($H_0/r_1$) plus the time used to remove a depth equal to $H_{2a}$ of the substrate 110 given by equation (13), namely $H_{2a}/r_2$. Therefore, the time of the first etch process is calculated by:

$$t_1 = \frac{H_0}{r_1} + \frac{1}{r_2}\left[\frac{\lambda}{2(n_2-1)}\left(1 - \frac{\Phi_0}{\pi}\frac{\ln T}{\ln T_0}\right) - \frac{r_2'}{r_1'}H_0\left(1 - \frac{\ln T}{\ln T_0}\right)\right] \qquad \text{Eq. (14)}$$

where the first term represents the portion of the phase shift etch period $t_1$ during which feature region 118 is etched from phase shift layer 112 and the second term represents the overetching period during which the thickness $H_{2a}$ of substrate layer 110 is removed.

The forgoing equations and derivation are based on an assumption that the substrate or the phase shift layer are homogeneous and that the etch rates during the first (plow) and second (trim) etch processes are uniform. However, a typical phase shift layer does not demonstrate homogenous behavior, and many phase shift layer parameters—for example, the index of refraction, absorption, and etch rate—may vary depending on the phase shift layer depth. An accurate analytical model for determining etch times can be problematic and parameters may not be obtained easily through the equations described above. However, a fully or partially empirical approach can be employed using experimentally established data.

Figure 3:
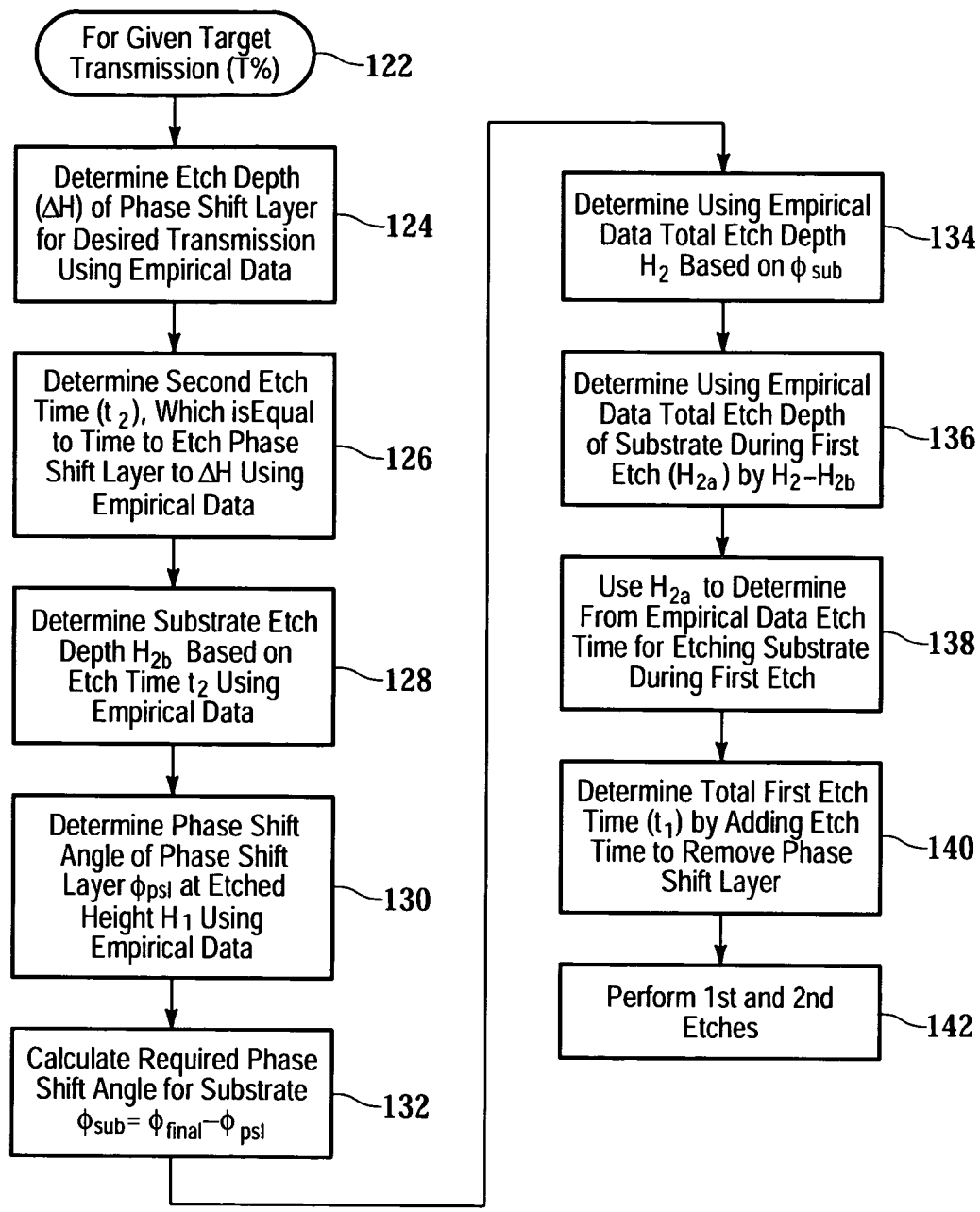
FIG. 3 is a flow chart of the basic steps of a process for determining etching times using empirically derived information to achieve a preselected attenuation and phase shift for an embedded attenuated phase shift photomask.

FIG. 3 illustrates a representative example of a process for determining etch times from a given target transmission using empirically derived data. It assumes that neither the substrate nor the phase shift layer is homogeneous. In this example, six response curves or look-up tables are generated empirically. These curves or tables relate (1) transmission of the substrate layer to etch depth (T % vs. $\Delta H$), (2) phase angle of remaining substrate layer versus etch depth ($\phi_{sub}$ vs. $\Delta H$), (3) etch time for second etch process (trim) to etch depth of substrate ($t_{2b}$ vs. $\Delta H$), (4) etch thickness of substrate to etch time for trimming the substrate ($H_{2b}$ vs. $t_2$), (5) etch substrate thickness to etch time for first etch (plow) of substrate ($H_{2b}$ vs. $t_1^{over}$) and (6) phase angle of substrate to etched depth ($\phi_{sub}$ vs. $H_2$).

Beginning at step 122 with a given target transmission T %, the depth of material to be removed from the phase shift layer 112 to achieve the desired transmission is determined at step 124. Empirically determined data relating thickness of the particular material used in phase shift layer and transmission is used to find the thickness corresponding to the desired transmission, which is then subtracted from the known thickness of the embedded phase shift layer to arrive at $\Delta H$, the etch depth for the phase shift layer. Empirically derived data relating etch depth and etch time for the particular phase shift layer material and etching process is used to determine the second etch, $t_2$ at step 126 using $\Delta H$.

Once the second etch time is determined, the depth of substrate removed during the second etch is determined. At step 128, empirical data relating etch depth to etch time for the particular substrate material and etching process is used to determine the etch depth $H_{2b}$ of the substrate during the second etch.

The next steps of the process determine the necessary depth to which the substrate must be etched during the first and second etches in order to arrive at the desired phase shift of $\pi$ radians or 180° between radiation passing unattenuated through the substrate in regions 118 and the radiation passing through the phase shift layer (as well as the substrate) in regions 120. Because the thickness of the phase shift layer after the second etch is known, the phase shift angle of the phase shift layer at the etched height (i.e. the trimmed phase shift layer) can be determined using empirical data that relates thickness of the phase shift layer to phase shift. This phase shift angle, $\phi_{psl}$, is then subtracted from the desired phase shift, +final, which is typically $\pi$ radians, to arrive in step 132 at the phase shift that must be introduced by the substrate, namely $\phi_{sub}$. Using empirical data that relates etch depth of the substrate to phase shift, total etch depth $H_2$ of the substrate can be determined. The total etch depth is the final depth to which the substrate is etched after the first and second etches.

Steps 130, 132, and 134 may also take place before, or concurrently with, steps 126 and 128.

The etch depth of the substrate during the first etch, $H_{2a}$, is determined by at step 136 by subtracting from the total etch depth needed for the substrate the etch depth of the substrate during the second etch, $H_{2b}$, determined at step 128. This will be referred to as the over etch time and denoted as $t_1^{over}$. The over etch time $t_1^{over}$ is determined from empirically determined data relating etch depth of the substrate to etch timed using $H_{2a}$ as the etch depth. At step 140, total etch time for the first etch, $t_1$, is calculated by adding the etch time to completely remove the phase shift layer, which is known. Once etch times are determined the photomask the first and second etch processes are performed at step 142 as part of a fabrication process for a photomask, as described in connection with FIG. 2.

Figure 4:
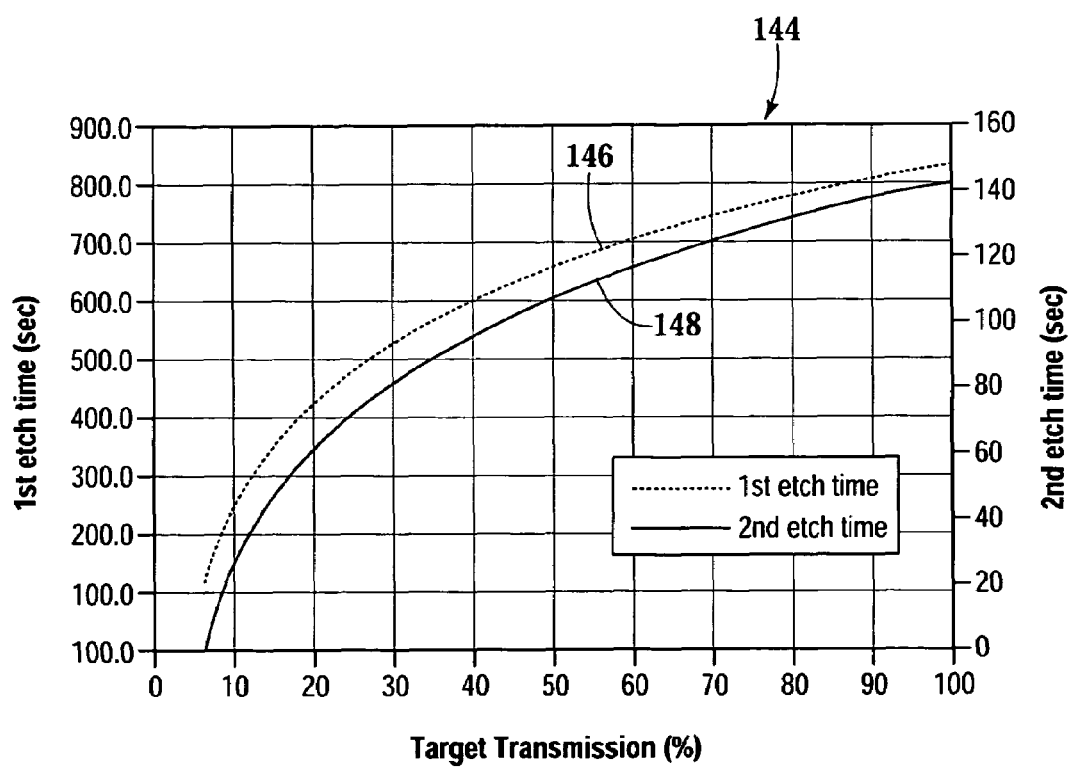
FIG. 4 is a plot of etching periods for producing an embedded attenuated phase shift mask of a tunable phase shift layer transmission.

The etch times for the first etch, or plow, and the second etch, or trim, of the phase shift layer are thus determined for a given desired transmittance. A table or graph plotting etch times for the first and second etch times against a desired transmittance can be constructed for a given type of photomask blank, i.e., one with a substrate and a phase shift layer made of given materials of given thicknesses, with given transmission and phase shift properties. An example such a graph is graph 144 of FIG. 4, with lines 146 and 148 plotting, respectively, first and second etch times against target transmission rate.

It is possible, at least in some cases, to assume that the substrate is homogeneous. If the substrate is assumed to be homogeneous, the etch rates for the substrate during the first and second etches may be assumed to be the same. From equations (8) and (9), the over etch time for the substrate, $t_1^{over}$, may be calculated using the following equation:

$$t_1^{over} = \frac{1}{r_2}\left[\frac{\lambda}{2(n_2-1)}\left(1 - \frac{\Phi_{Sub}}{\pi}\right) - r_2't_2\right] \qquad \text{eq. 13}$$

The total etch time for the first etch can then be determined by adding to the over etch time the time to plow or completely remove the phase shift layer. Steps 124, 126 and 130 of FIG. 3 would be carried out to determine the second etch time, $t_2$, and the phase shift of the trimmed phase shift layer, $\phi_{psl}$. These values may then be substituted into equation (13) to calculate the over etch time $t_1^{over}$. The total time for the first etch is then calculated using the overetch time, as described above at step 140.

Figure 5:
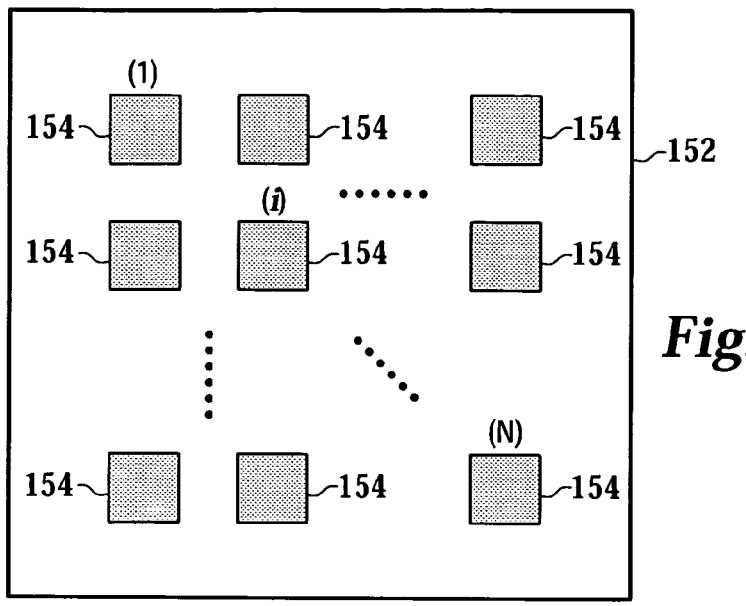
FIG. 5 is a schematic illustration of a matrix test device formed on a single embedded attenuated phase shift photomask blank for testing different levels of attenuation, phase shift and/or other adjustable parameters.
Figure 6:
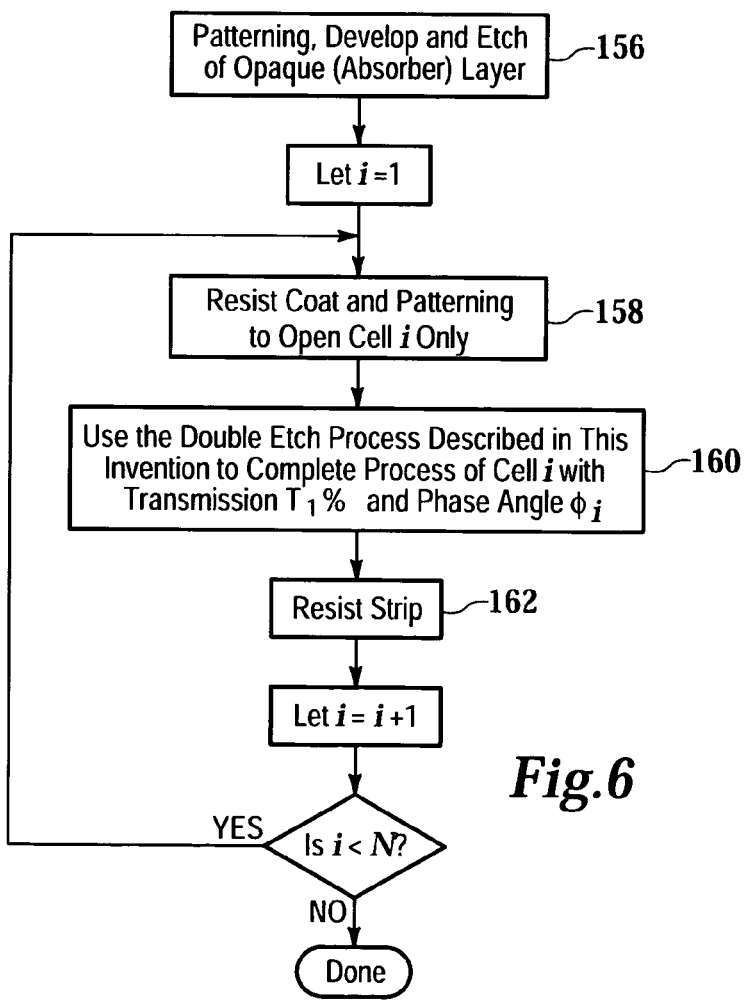
FIG. 6 is a flow chart illustrating the basic process steps of fabricating the matrix test device of FIG. 5.

Referring now to FIG. 6, control over transmission of a phase shift layer in an embedded attenuated phase shift mask independently of the phase shift angles enables fabrication of a matrix test device having a plurality of cells, each with different transmission and phase shifting angles on a single photomask. The cells are fabricated by repeating the process described above one region at a time on the photomask. An example of such a matrix test device is shown in FIG. 5. A single photomask 152 has formed on it a plurality of test cells 154, each with potentially different phase shifting conditions, such as a different transmission, phase shifting angle, and tri-tone. An example of a process for fabricating such a test device is shown in FIG. 6. Step 156 represents standard patterning, developing and etching processes for creating the necessary pattern for the absorbing or opaque layer, e.g. the chrome layer. For each cell that is to be fabricated, the following steps are repeated. At step 158, the photomask is coated with resist and exposed with a pattern that exposes just the cell of interest. The process described above in connection with FIG. 1 is undertaken at step 160 for a given transmission and phase shift angle. The resist is then stripped at step 162 and the process repeated for the next cell.

The best results in a wafer lithography come from achieving the greatest possible process latitude, depth of focus and resolution. Integrating multiple phase shift parameters on a single photomask allows for direct comparison and optimization of phase shift parameters for best wafer lithography results. Simulations are frequently used in connection with generating data for 193 and 157 nm lithography. Such simulations are often limited by the accuracy of the model and constraints on the number of variables. With a photomask as described above, such simulations are no longer necessary for obtaining data for determining the best phase shift mask configuration. Real data from semiconductor wafers made with photomasks having multiple phase shift parameters can be used in addition to the simulations. The real data generated from such a photomask described above can be used not only to identify optimal phase shifting conditions of photomask for wafer lithography, but also to validate simulation models, as well to correct the models. Integration of different phase shift parameters on a single photomask also reduces costs, as multiple photomasks are no long required, and eliminates the effect of wafer process variations on the optimization process using multiple photomasks.

While the invention has been particularly shown and described by the foregoing detailed description, it will be understood by those skilled in the art that various changes, alterations, modifications, mutations and derivations in form and detail may be made without departing from the spirit and scope of the invention.

What is claimed is:

1. An embedded attenuated phase shift mask comprising a translucent substrate, an embedded phase shift layer comprised of phase shifting and attenuating material overlaying the substrate, and a layer of opaque material over laying the embedded phase shift layer, wherein areas of the opaque material have been removed to define a circuit pattern; and within the areas of the removed opaque material, first regions of the embedded layer of are completely removed, second regions of the embedded layer are thinned to a predetermined height equivalent to a predetermined level of attenuation, and regions of the substrate adjacent the second regions of the embedded layer are etched to a predetermined depth such that radiation passing through the second region of the embedded phase shift layer is phase shifted a predetermined amount with respect to radiation passing through the first region.

2. The embedded attenuated phase shift mask of claim 1 further comprising a plurality of test cells, wherein at least one of the plurality of test cells has first attenuation and the second one of the plurality of test cells has a second attenuation different from the first.

3. The embedded phase shift mask of claim 1 further comprising a plurality of test cells, wherein at least one of the plurality of test cells has first phase shift and the second one of the plurality of test cells has a second phase shift different from the first.

4. The embedded attenuated phase shift mask of claim 1, wherein the opaque material comprises chrome or MoSi.

5. The embedded attenuated phase shift mask of claim 1, wherein the phase shift material comprises molybdenum, titanium, silicon or nitrogen.

6. An embedded attenuated phase shift mask comprising:
a layer of opaque material having a first pattern formed therein;
a layer of phase shift material having a second pattern formed therein underlying the layer of opaque material, the second pattern comprising at least one removed portion, at least one recessed portion and at least one non-recessed portion, the at least one non-recessed portion of the second pattern coinciding with the first pattern, the at least one recessed portion being recessed to a depth that is predetermined based on a desired transmittance of the mask; and
a substantially transparent substrate having a third pattern formed therein underlying the layer of phase shift material, the third pattern coinciding with the at least one removed portion of the second pattern and having a depth that is predetermined based on a desired phase shift of the mask.

7. A method for fabricating an embedded attenuated phase shift photomask, the photomask including a substrate, an embedded phase shift layer of known thickness and an opaque layer, the method comprising:
completely removing in first regions of the photomask the phase shift layer;
removing to a predetermined depth in the first region the substrate underlying the removed first regions of the phase shift layer; and
thinning in second regions of the photomask the phase shift layer to achieve a predetermined attenuation for radiation passing through the second regions;
whereby the relative phase shift between radiation passing through first regions and the second regions is equal to a desired phase shift.

8. The method of claim 7, wherein the completely removing the phase shift layer and removing to a predetermined depth areas of the substrate are undertaken during the same etching process.

9. The method of claim 7, wherein
in the second regions, the phase shift layer is thinned by an etching process that also removes an additional amount of the substrate in the first regions; and
the predetermined depth is chosen such that, after the additional amount of the substrate is removed during thinning of the phase shift layer, the total depth of the removed substrate in the first region causes a predetermined relative phase shift between radiation passing through the first and second regions.

10. The method of claim 7, wherein thinning the phase shift layer includes an etching process to remove material from the phase shift layer, and wherein a time for the second etching of the phase shift layer is chosen based on the predetermined attenuation.

11. The method of claim 10, wherein the etching process removes additional amounts of the substrate in the first regions, and wherein the predetermined depth is determined such that, after removal of an additional amount of the substrate during etching of the phase shift layer, the total depth of the removed substrate in the first region causes a predetermined relative phase shift between radiation passing through the first and second regions.

12. An embedded attenuated phase shift mask comprising:
a plurality of test cells, each of the plurality of test cells having at least one phase shifting condition that differs from that of the other test cells, each of the plurality of test cells comprising:
a layer of opaque material having a first pattern formed therein;
a layer of phase shift material having a second pattern formed therein underlying the layer of opaque material, the second pattern comprising at least one removed portion, at least one recessed portion and at least one non-recessed portion, the at least one non-recessed portion of the second pattern coinciding with the first pattern; and
a substantially transparent substrate having a third pattern formed therein underlying the layer of phase shift material, the third pattern coinciding with the at least one removed portion of the second pattern.

13. The embedded attenuated phase shift mask of claim 12, wherein the at least one phase shifting condition is chosen from the group consisting of transmittance, phase shifting angle and tri-tone.

14. The embedded attenuated phase shift mask of claim 13, wherein the at least one phase shifting condition is transmittance, and the at least one recessed portion of the second pattern is recessed to a depth that is predetermined based on a desired transmittance of a corresponding test cell.

15. The embedded attenuated phase shift mask of claim 13, wherein the at least one phase shifting condition is phase shift angle, and the third pattern has a depth that is predetermined base on a desired phase shift angle of a corresponding test cell.

16. The embedded attenuated phase shift mask of claim 12, wherein the plurality of test cells are arranged in a matrix.

17. A method of forming an embedded attenuated phase shift photomask from a blank photomask, the blank photomask comprising a substrate, a phase shift layer formed over the substrate, and an opaque layer formed over the phase shift layer, the method comprising the steps of:
removing at least one first portion of the opaque layer and an at least one corresponding first portion of the phase shift layer to expose at least one portion of the substrate;
removing the exposed at least one portion of the substrate to a depth $D_1$;
removing at least one second portion of the opaque layer to expose at least one corresponding second portion of the phase shift layer; and
removing the exposed at least one second portion of the phase shift layer to a depth $D_2$ to achieve a desired transmittance of the phase shifting layer, the depth $D_1$ being predetermined based on the desired relative phase shift between the at least one portion of the substrate and the at least second portion of the phase shift layer.

18. The method of claim 17, wherein the depth $D_2$ of removal of the at least one second portion of the phase shift layer is determined by the following equation:

$$D_2 = D_0\left(1 - \frac{\ln T}{\ln T_0}\right)$$

wherein "$D_0$" denotes an initial phase shift layer thickness, "T" denotes a desired transmission of the phase shift layer at a wavelength $\lambda$, and "$T_0$" denotes an initial transmission of the phase shift layer at the wavelength $\lambda$.

19. The method of claim 18, wherein the exposed at least one portion of the substrate is further removed during the step of removing the exposed at least one second portion of the phase shift layer.

20. The method of claim 19, wherein the depth $D_1$ of removal of the exposed at least one portion of the substrate is determined by the following equation:

$$D_1 = \frac{\lambda}{2(n_2 - 1)}\left(1 - \frac{\Phi_0}{\pi}\frac{\ln T}{\ln T_0}\right) - \frac{r_2'}{r_1'}D_0\left(1 - \frac{\ln T}{\ln T_0}\right)$$

wherein "$n_2$" denotes an index of refraction of the substrate at the wavelength $\lambda$, "$\Phi_0$" denotes a phase angle of the phase shift layer at the wavelength $\lambda$ and at the initial phase shift layer thickness $D_0$, $r_1'$ denotes an etch rate of the phase shift layer during the step of removing at least one first portion of the opaque layer and an at least one corresponding first portion of the phase shift layer, and $r_2'$ denotes an etch rate of the substrate during the step of removing the exposed at least one second portion of the phase shift layer.

21. A method of forming a semiconductor device comprising the steps of:
interposing an embedded attenuated phase shift mask between a semiconductor wafer and an energy source, wherein the embedded attenuated phase shift mask comprises:
a layer of opaque material having a first pattern formed therein;
a layer of phase shift material having a second pattern formed therein underlying the layer of opaque material, the second pattern comprising at least one removed portion, at least one recessed portion and at least one non-recessed portion, the at least one non-recessed portion of the second pattern coinciding with the first pattern, the at least one recessed portion being recessed to a depth that is predetermined based on a desired transmittance of the mask; and a substantially transparent substrate having a third pattern formed therein underlying the layer of phase shift material, the third pattern coinciding with the at least one removed portion of the second pattern and having a depth that is predetermined based on a desired phase shift of the mask;

generating energy in the energy source;

transmitting the generated energy through the patterns formed in the opaque material layer, the phase shift material layer and the substrate of the embedded attenuated phase shift mask to the semiconductor wafer; and etching an image on the semiconductor wafer corresponding to the patterns formed in the opaque material layer, the phase shift material layer and the substrate of the embedded attenuated phase shift mask.

* * * * *